US012772868B2

(12) United States Patent
Liu

(10) Patent No.: US 12,772,868 B2
(45) Date of Patent: Oct. 20, 2026

(54) SEMICONDUCTOR DEVICE WITH DUAL DOWNSET LEADFRAME AND METHOD THEREFOR

(71) Applicant: NXP B.V., Eindhoven (NL)

(72) Inventor: Chang Hao Liu, Kaohsiung City (TW)

(73) Assignee: NXP B.V., Eindhoven (NL)

( * ) Notice: Subject to any disclaimer, the term of this patent is extended or adjusted under 35 U.S.C. 154(b) by 395 days.

(21) Appl. No.: 18/424,998

(22) Filed: Jan. 29, 2024

(65) Prior Publication Data

US 2025/0246521 A1 Jul. 31, 2025

(51) Int. Cl.

| | |
|---|---|
| ***H10W 70/40*** | (2026.01) |
| ***H10W 72/00*** | (2026.01) |
| ***H10W 72/20*** | (2026.01) |
| ***H10W 72/90*** | (2026.01) |
| ***H10W 74/00*** | (2026.01) |
| ***H10W 74/10*** | (2026.01) |
| ***H10W 80/00*** | (2026.01) |
| ***H10W 90/00*** | (2026.01) |

(52) U.S. Cl.

CPC ........ *H10W 70/424* (2026.01); *H10W 74/114* (2026.01); *H10W 72/019* (2026.01); *H10W 72/07252* (2026.01); *H10W 72/221* (2026.01); *H10W 72/9415* (2026.01); *H10W 74/00* (2026.01); *H10W 80/743* (2026.01); *H10W 90/726* (2026.01)

(58) Field of Classification Search

CPC ............. H10W 70/424; H10W 74/114; H10W 72/019; H10W 72/07252; H10W 72/221; H10W 72/9415; H10W 74/00; H10W 80/743; H10W 90/726

See application file for complete search history.

(56) References Cited

U.S. PATENT DOCUMENTS

| | | | | |
|---|---|---|---|---|
| 6,075,284 | A | 6/2000 | Choi et al. | |
| 6,337,510 | B1 | 1/2002 | Chun-Jen et al. | |
| 7,476,976 | B2 | 1/2009 | Lange et al. | |
| 8,035,207 | B2 | 10/2011 | Camacho et al. | |
| 8,072,047 | B2 | 12/2011 | Camacho et al. | |
| 8,319,323 | B2 | 11/2012 | Letterman et al. | |
| 8,410,587 | B2 | 4/2013 | Lee et al. | |
| 2003/0228720 | A1 * | 12/2003 | Ito ....................... | H10W 70/427 257/E23.047 |
| 2018/0040541 | A1 | 2/2018 | Choi et al. | |
| 2022/0262762 | A1 * | 8/2022 | Ryu .................... | H10W 40/778 |
| 2024/0014123 | A1 | 1/2024 | Mao et al. | |

* cited by examiner

*Primary Examiner* — Jay C Kim
*Assistant Examiner* — Woo K Lee

(57) ABSTRACT

A semiconductor device is provided. The semiconductor device includes a leadframe having a plurality of leads. A first lead of the plurality of leads has a lead pad formed between a distal portion and a proximal portion of the first lead. A semiconductor die includes a plurality of bond pads located at an active side. Each bond pad of the plurality is connected to a respective lead of the plurality of leads. An encapsulant encapsulates the semiconductor die and at least a portion of the leadframe. A distal portion of each lead is exposed through the encapsulant at a first major side. The lead pad is exposed through the encapsulant at a second major side opposite of the first major side.

19 Claims, 7 Drawing Sheets

SEMICONDUCTOR DEVICE WITH DUAL DOWNSET LEADFRAME AND METHOD THEREFOR

BACKGROUND

Field

This disclosure relates generally to semiconductor device packaging, and more specifically, to semiconductor devices with a dual downset leadframe and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a dual downset leadframe. The semiconductor device includes a semiconductor die mounted on a package leadframe. The leadframe includes a plurality of leads. Each lead of the plurality has a proximal portion located near the semiconductor die and a distal portion located near an outer perimeter of the semiconductor device package. The proximal portions are downset by a first distance sufficient for the backside of the mounted semiconductor die to be substantially coplanar with the distal portions of the leads. Bond pads of the semiconductor die are conductively connected to respective proximal portions of the leads the leadframe. A lead pad is formed between the distal portion and the proximal portion of at least one lead of the plurality. A plurality of lead pads may be formed on corresponding leads of leadframe. Each lead pad is downset a second distance farther from the semiconductor die than the first downset distance. The semiconductor die and the leadframe are encapsulated with an encapsulant. Each lead pad of the plurality of lead pad of the plurality of lead pads is exposed through the top side of the encapsulant. Likewise, the backside of the semiconductor die and the distal portion of each lead of the plurality of leads is exposed through the bottom side of the encapsulant. The exposed distal portions of the leads are configured for attachment to a printed circuit board and the exposed lead pads are configured for attachment of an external component, for example. By forming the semiconductor device with the dual downset leadframe in this manner, cost effective and improved reliability through package interconnects and semiconductor die connections may be realized.

Figure 1:
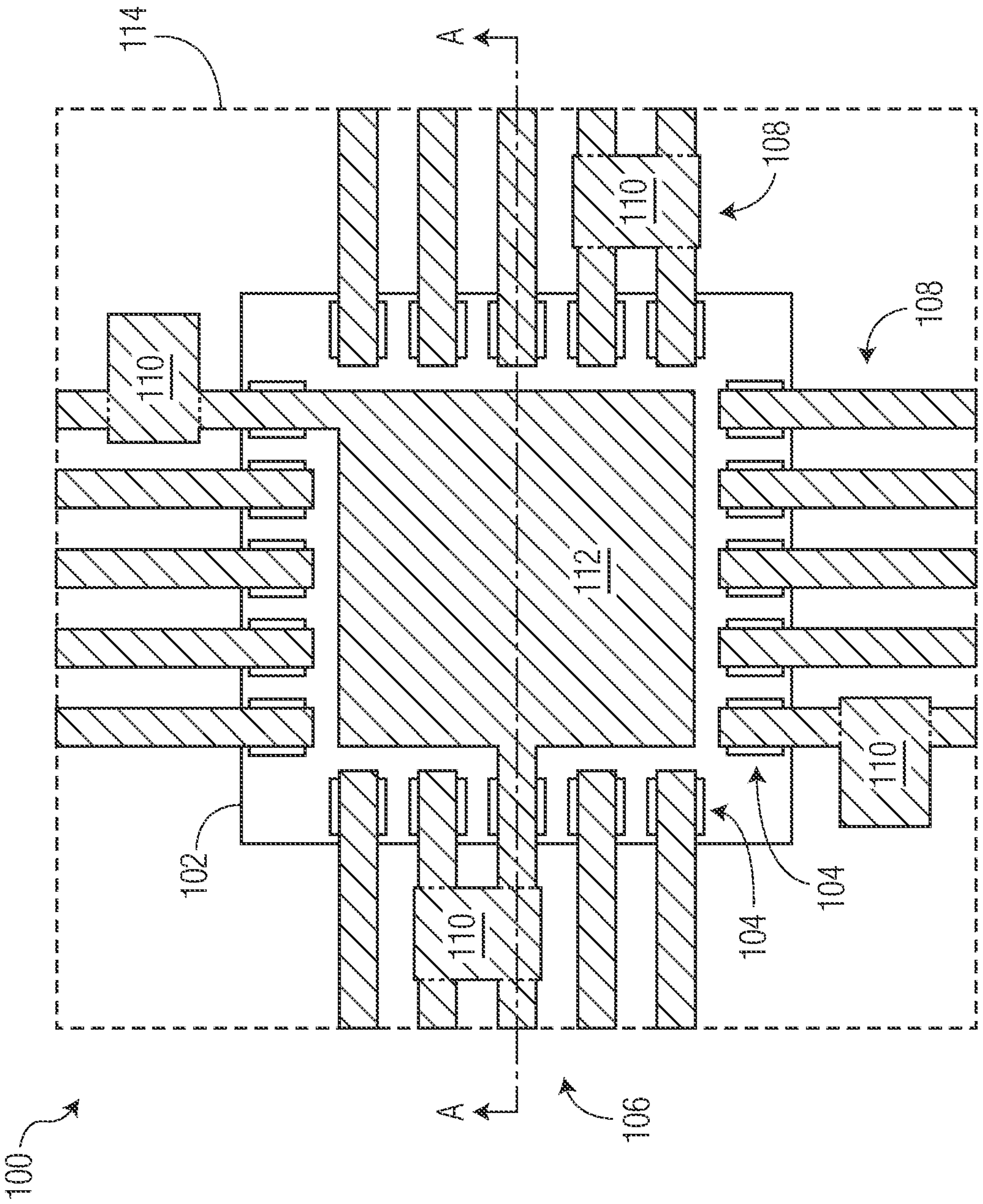
FIG. 1 illustrates, in a simplified top-side-up plan view, an example semiconductor device having a dual downset leadframe at a stage of manufacture in accordance with an embodiment.

FIG. 1 illustrates, in a simplified top-side-up plan view, an example semiconductor device 100 having a dual downset leadframe at a stage of manufacture in accordance with an embodiment. At this stage, the semiconductor device 100 includes a semiconductor die 102 mounted on a package leadframe 106. The semiconductor die 102 is configured in an active side up orientation. A plurality of bond pads 104 are located at an active side of the semiconductor die 102. The leadframe 106 includes a plurality of leads 108. Each lead 108 of the plurality of leads includes a proximal portion located near the semiconductor die 102 and a distal portion located near an outer perimeter 114 (shown as dashed outline for reference) of the semiconductor device 100. In this embodiment, the semiconductor die 102 is mounted below the leadframe 106 such that the proximal portions of the leads 108 overlap a portion of the semiconductor die. Each bond pad 104 of the plurality of bond pads is conductively connected to the proximal portion of a respective lead 108 by way of a die connector (not shown). The term "conductive," as used herein, generally refers to electrical conductivity unless otherwise described. In some embodiments, the proximal portions of the leads 108 may not overlap the semiconductor die 102 and may be connected to respective bond pads 104 by way of bond wires.

The major side of the semiconductor die 102 having circuitry and bond pads 104 is characterized as the active side and the major side of the semiconductor die 102 opposite of the active side is characterized as the backside. The semiconductor die 102 may be formed from a suitable semiconductor material, such as silicon, germanium, gallium arsenide, gallium nitride, and the like. The semiconductor die 102 may include digital circuits, analog circuits, RF circuits, power circuits, memory, processor, the like, and/or combinations thereof formed at the active side, for example.

In this embodiment, lead pads 110 are formed between distal portions of the leads 108 and proximal portions of the leads. A lead pad 110 may be formed as a portion of a single lead or as a portion of multiple leads such as a single lead plus one or more neighboring leads connected together by way of the lead pad, for example. The leadframe 106 may include a flag portion 112 substantially surrounded by the proximal portions of the leads 108. The flag portion 112 may be connected in a manner to serve as a ground plane proximate to the active side of the semiconductor die 102, for example. In this embodiment, the leadframe 106, including the plurality of leads 108, lead pads 110, and flag portion 112, is formed from a same contiguous metal sheet (e.g., by way of a stamping process). The leadframe 106 may be formed from any suitable electrically conductive metal material, such as copper, silver, nickel, aluminum, or iron, or alloys thereof, for example. The conductive metal may be bare, partially plated, or plated with another metal or alloy such thereof. In this embodiment, the leadframe 106 is configured for a quad flat no-lead (QFN) type package. The number and arrangement of the leads 108, lead pads 110, and flag portion 112 in this embodiment are chosen for illustration purposes. Simplified cross-sectional views of the example semiconductor device 100 taken along line A-A at stages of manufacture are depicted in FIG. 2 through FIG. 5.

Figure 2:
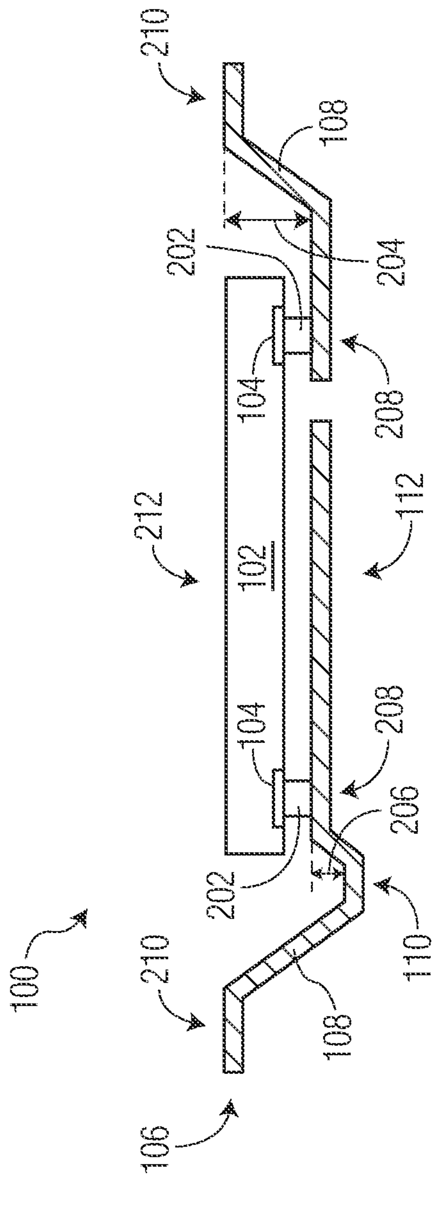
FIG. 2 through FIG. 5 illustrate, in simplified cross-sectional views, the example semiconductor device at stages of manufacture in accordance with an embodiment.

FIG. 2 illustrates, in a simplified bottom-side-up cross-sectional view, the example semiconductor device 100 at a stage of manufacture in accordance with an embodiment. At this stage, the semiconductor device 100 includes the semiconductor die 102 mounted on the package leadframe 106. Bond pads 104 are conductively connected to the proximal portion 208 of respective leads 108 by way of conductive die connectors 202. In this embodiment, the die connectors 202 are formed as stud bumps having a first end directly connected to respective die pads 104 and a second end directly connected to proximal portions 208 of corresponding leads 108 of the leadframe 106. The stud bumps may be formed from a conductive material such as gold, copper, aluminum, solder, or alloys thereof, for example. In other embodiments, the die connectors 202 may be formed as copper pillars, solder balls, and the like.

The lead pad 110 of the leadframe 106 is formed between the distal portion 210 and the proximal portion 208 of the lead 108 (e.g., lead 108 located on left side). The lead pad 110 is located on a plane substantially parallel with a plane of the proximal portion 208 of the lead 108. The lead pad 110 may be formed as a portion of a single lead or as a portion of multiple leads connected together by way of the lead pad, for example. In this embodiment, the leadframe 106 includes a flag portion 112 connected to the proximal portion 208 of the lead 108. The flag portion 112 may be configured as a ground plane proximate to the active side of the semiconductor die 102 when connected to ground voltage supply, for example.

In this embodiment, the leads 108 of the leadframe 106 are formed (e.g., bent) in a dual downset configuration. For example, a first downset lead (e.g., lead 108 located on right side) is downset by a first vertical distance 204 as measured vertically from a plane of the distal portion 210 of the first downset lead to a plane of the proximal portion 208 of the first downset lead. In this embodiment, the first vertical distance 204 is a predetermined downset dimension substantially equal to the thickness of the semiconductor die 102 plus vertical length of the die connector 202. A second downset lead (e.g., lead 108 located on left side) is downset by a second vertical distance substantially equal to the vertical distance 204 plus a vertical distance 206 as measured vertically from a plane of the distal portion 210 of the second downset lead to a plane of the lead pad 110 of the second downset lead. For example, the lead pad 110 of the second downset lead is located on a plane substantially farther away from the active surface of the semiconductor die 102 than a plane of the proximal portion 208 of the lead by the vertical distance 206. The second vertical distance 206 is a predetermined downset dimension by which the second downset extends below the proximal portion 208 of the second downset lead (as depicted in FIG. 2) to allow for a sufficient amount of encapsulant to be formed over the active side of the semiconductor die 102 at a subsequent stage of manufacture, for example. In this embodiment, the distal portion 210 of each lead 108 of the plurality of leads is substantially coplanar with the backside 212 of the semiconductor die 102.

Figure 3:
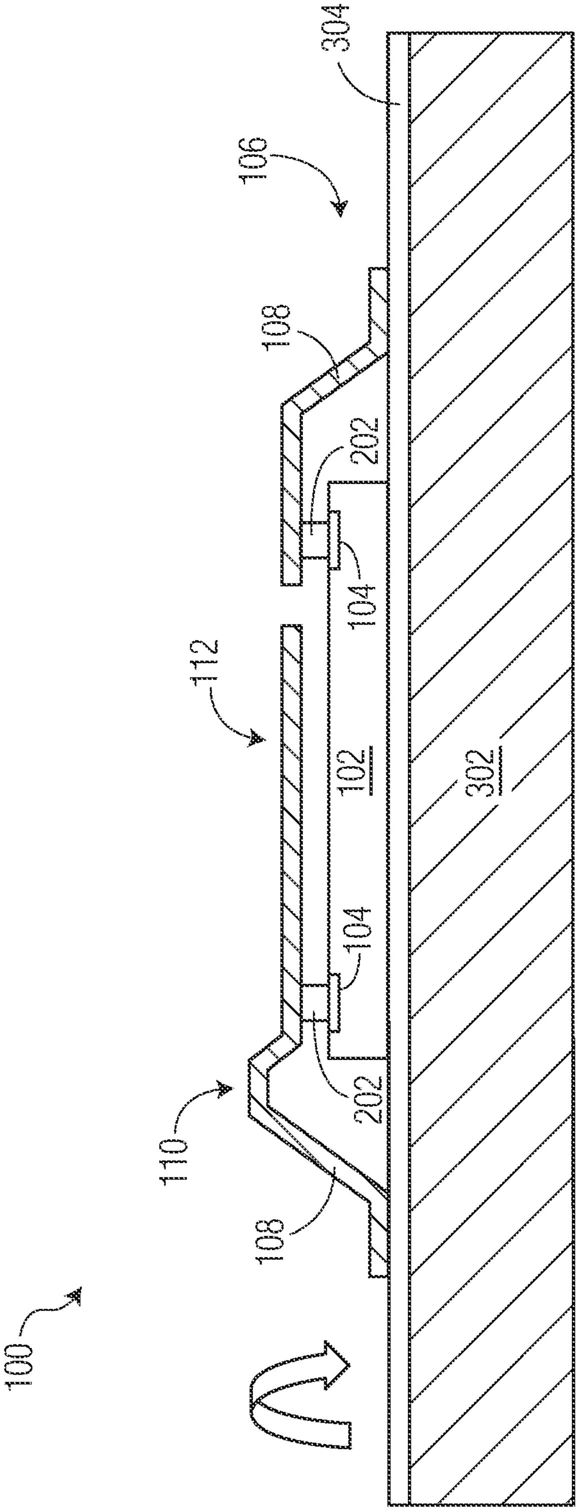

FIG. 3 illustrates, in a simplified top-side-up cross-sectional view, the example semiconductor device 100 at a subsequent stage of manufacture in accordance with an embodiment. At this stage, the semiconductor device 100 includes the mounted semiconductor die 102 on the leadframe 106, reoriented (e.g., flipped), and placed on a carrier substrate 302. The carrier substrate 302 includes a releasable adhesive 304 applied on a top surface. In this embodiment, semiconductor die 102 is oriented with the active side up having the backside of the semiconductor die 102 and distal portions of the leads 108 temporarily affixed on the carrier substrate 302. The carrier substrate 302 is configured and arranged to provide a temporary structure for placement of the mounted semiconductor die 102 and leadframe 106 during an encapsulation process at a subsequent stage of manufacture, for example.

Figure 4:
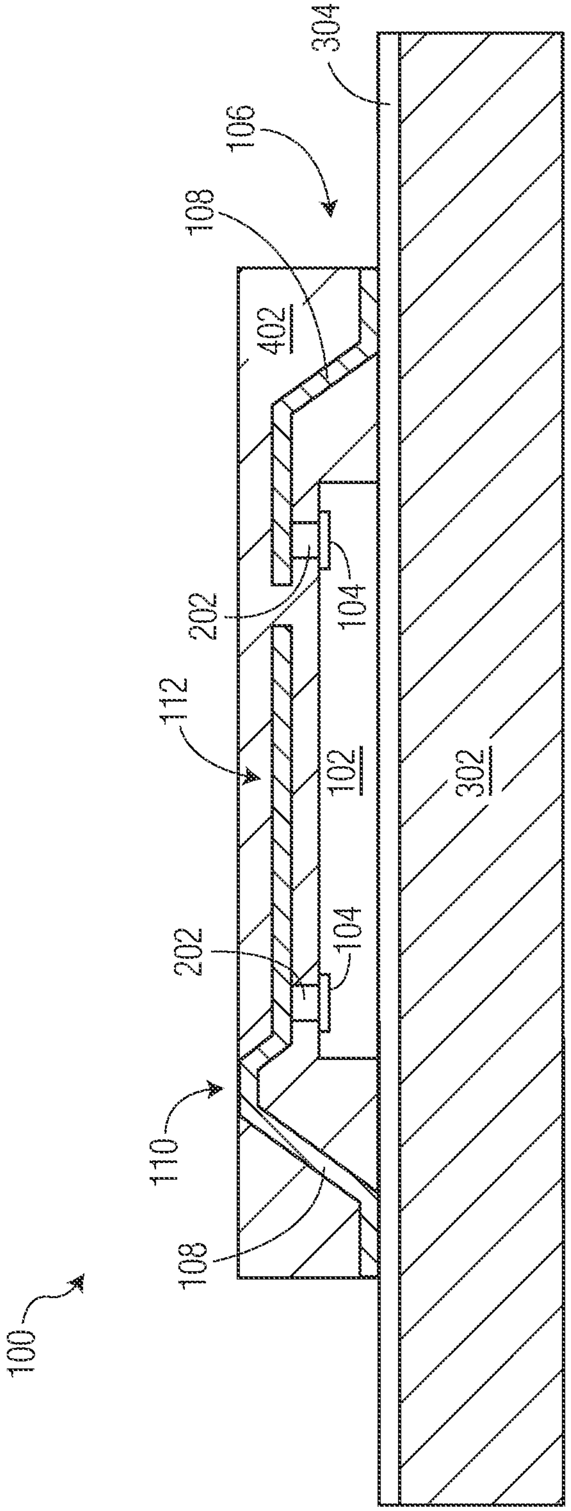

FIG. 4 illustrates, in a simplified top-side-up cross-sectional view, the example semiconductor device 100 at a subsequent stage of manufacture in accordance with an embodiment. At this stage, the semiconductor device 100 includes the semiconductor die 102 and the leadframe 106 at least partially encapsulated with an encapsulant 402 while temporarily affixed on the carrier substrate 302. In this embodiment, the semiconductor die 102 and the leadframe 106 may be encapsulated with the encapsulant 402 (e.g., epoxy molding compound) by way of a film-assisted molding (FAM) process. For example, a FAM tool using a conformal film may be engaged with the top surface of the lead pad 110 of the leadframe 106 during the molding process to keep the top surface of the lead pad 110 free from encapsulant. Accordingly, the lead pad 110 is exposed through the encapsulant 402 at the top major surface. In an alternative embodiment, the semiconductor die 102 and the leadframe 106 may be over-molded with the encapsulant 402 by way of an injection molding or transfer molding process, and subsequently subjecting the top surface of the encapsulant 402 to a grind process to expose a top surface of the lead pad 110 through the encapsulant, for example. In this embodiment, the lead pad 110 exposed through the top major side of the encapsulant 402 is configured for connection of one or more external components such as semiconductor die, sensors, active elements, passive elements, antennas, heat sinks, connectors, the like, and combinations thereof.

Figure 5:
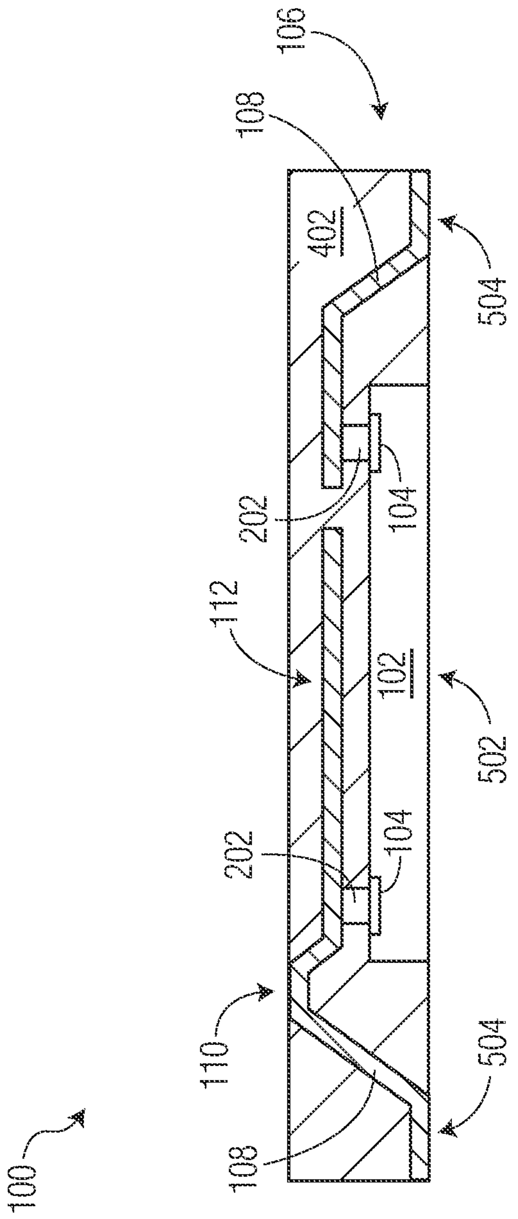

FIG. 5 illustrates, in a simplified top-side-up cross-sectional view, the example semiconductor device 100 at a subsequent stage of manufacture in accordance with an embodiment. At this stage, the semiconductor device 100 is separated from the carrier substrate 302. In this embodiment, the backside 502 of the semiconductor die 102 and distal portions 504 of the leads 108 of the leadframe 106 are revealed through the bottom major side of the encapsulant 402 when the carrier substrate 302 is removed. The exposed distal portion 504 of the leads 108, the exposed backside 502 of the semiconductor die 102, and the bottom surface of the encapsulant 402 are substantially coplanar. After the carrier substrate 302 is removed, the exposed backside 502 of the semiconductor die 102 and exposed distal portions 504 of the leads 108 may be conductively affixed (e.g., by way of a solder connection) to a printed circuit board (PCB). For example, the exposed distal portions 504 of the leads 108 may be connected to the PCB to provide input and/or output signals and power supply connectivity between the semiconductor die 102 and the PCB and among the semiconductor die 102, PCB, and exposed lead pads 110 at the top surface of the encapsulant 402. Further, the exposed backside 502 of the semiconductor die 102 may be connected to the PCB to provide a backside ground connection to the semiconductor die 102 and/or augment heat dissipation by way of the PCB, for example.

Figure 6:
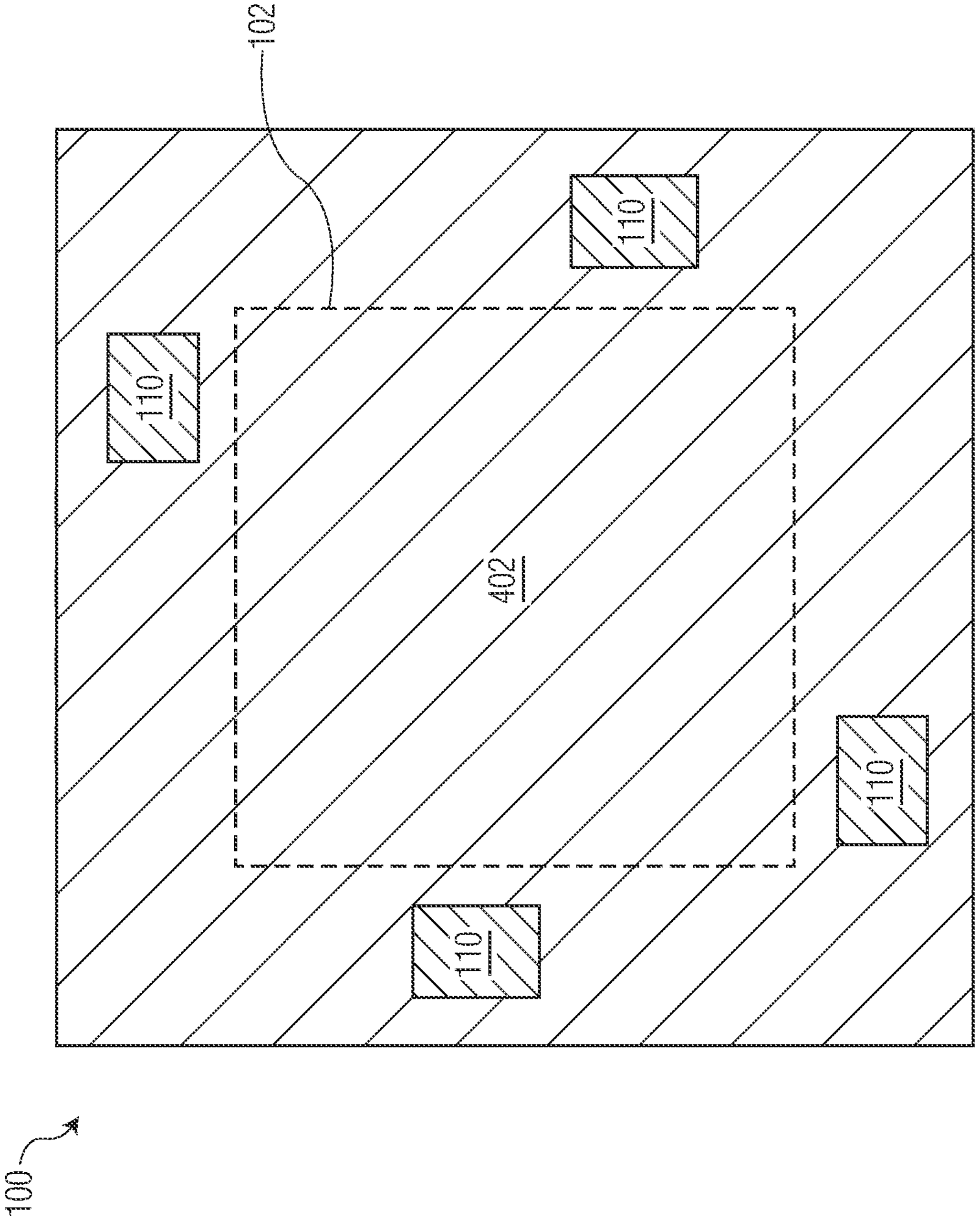
FIG. 6 illustrates, in a simplified top-side-up plan view, the example semiconductor device after encapsulation and singulation in accordance with an embodiment.

FIG. 6 illustrates, in a simplified top-side-up plan view, the example semiconductor device 100 at a stage of manufacture after encapsulation and singulation in accordance with an embodiment. At this stage, the semiconductor device 100 is encapsulated with the encapsulant 402 and singulated. In this embodiment, the lead pads 110 of the leadframe 106 are exposed through the top major side of the encapsulant 402. In this embodiment, the lead pads 110 provide conductive through package connectivity with the exposed distal portions 504 of the leads 108 of FIG. 5 and with the encapsulated semiconductor die 102 (shown as dashed outline for reference). The lead pads 110 may be arranged in a package-on-package (PoP) configuration for connection of an external packaged component or other external components such as semiconductor die, sensors, active elements, passive elements, antennas, heat sinks, connectors, the like, and combinations thereof. The lead pads 110 may be bare or otherwise plated to facilitate connection of the external component(s).

Figure 7:
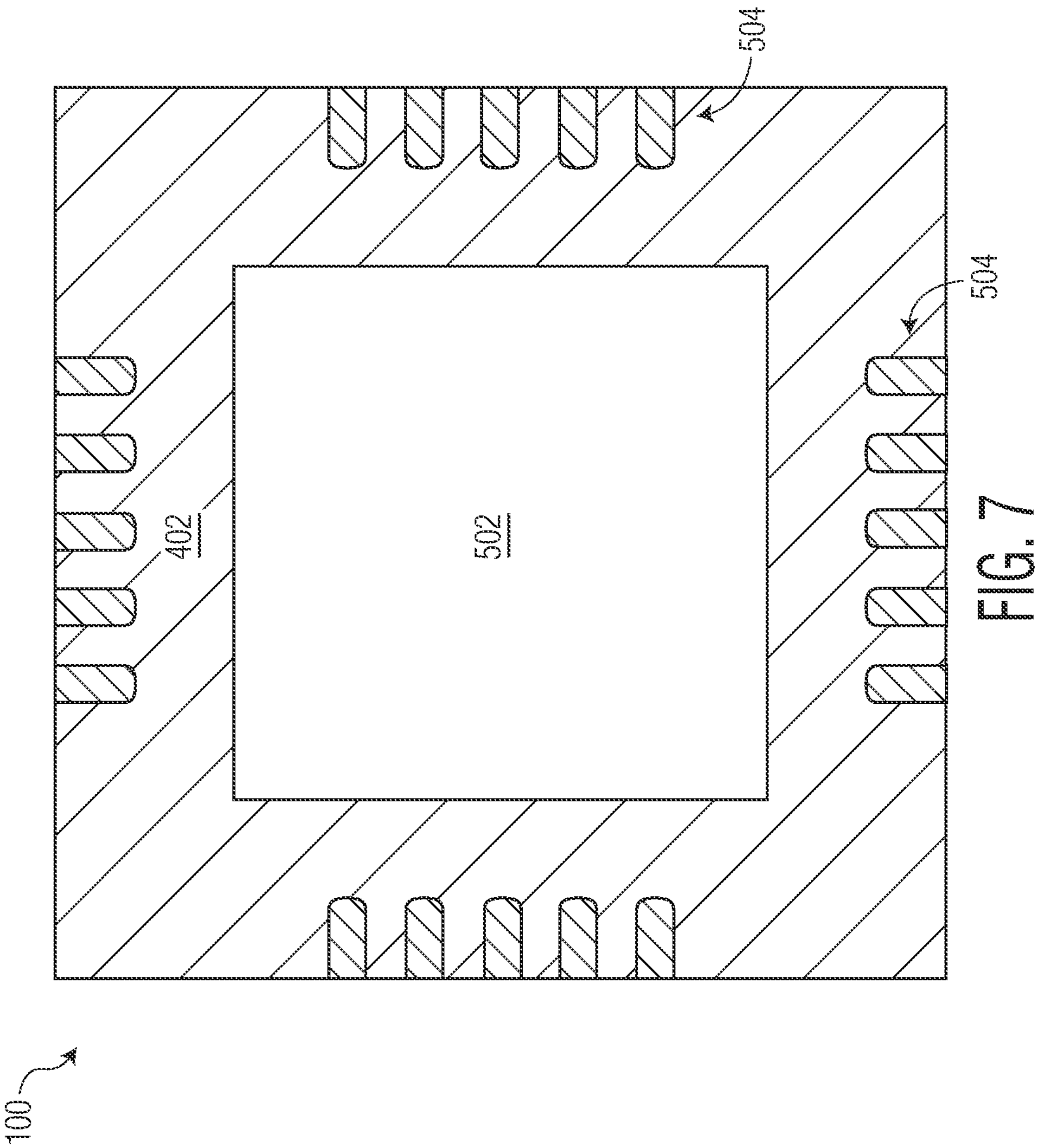
FIG. 7 illustrates, in a simplified bottom-side-up plan view, the example semiconductor device after encapsulation and singulation in accordance with an embodiment.

FIG. 7 illustrates, in a simplified bottom-side-up plan view, the example semiconductor device 100 at the stage of manufacture depicted in FIG. 6 in accordance with an embodiment. At this stage, the semiconductor device 100 is encapsulated with the encapsulant 402 and singulated. In this embodiment, the backside 502 of the semiconductor die 102 and the distal portions 504 of the leads 108 of the leadframe 106 are exposed through the bottom major side of the encapsulant 402. The exposed distal portions 504 of the leads 108 are distributed around an outer perimeter of the encapsulated semiconductor device 100 and substantially surround the exposed backside 502 of the semiconductor die 102. A cross section of the distal portions 504 of the leads 108 may be exposed at the outer sidewalls of the encapsulant 402. In this embodiment, the exposed distal portions 504 of the leads provide conductive through package connectivity with the lead pads 110 of FIG. 6 and with the encapsulated semiconductor die 102 of FIG. 6. The exposed distal portions 504 of the leads may be connected to the PCB by way of a solder paste or conductive adhesive, for example, to provide input and/or output signals and power supply connectivity between the semiconductor die and the PCB. The exposed backside 502 of the semiconductor die may be connected to the PCB by way of a solder paste or conductive adhesive, for example, to provide a backside ground connection to the semiconductor die and/or augment heat dissipation by way of the PCB. The distal portions 504 of the leads may be bare or otherwise plated to facilitate connection with the PCB.

Generally, there is provided, a semiconductor device including a leadframe including a plurality of leads, a first lead of the plurality of leads having a lead pad formed between a distal portion of the first lead and a proximal portion of the first lead; a semiconductor die having a plurality of bond pads located at an active side of the semiconductor die, each bond pad of the plurality of bond pads connected to a respective lead of the plurality of leads; and an encapsulant encapsulating the semiconductor die and at least a portion of the leadframe, a distal portion of each lead of the plurality of leads exposed through the encapsulant at a first major side and the lead pad exposed through the encapsulant at a second major side opposite of the first major side. A backside of the semiconductor die may be exposed through the encapsulant at the first major side. Each bond pad of the plurality of bond pads may be connected to the respective lead of the plurality of leads by way of a die connector. The first lead of the plurality of leads may be formed such that the lead pad is located on a plane farther from the semiconductor die than a plane of the proximal portion of the first lead. The first lead may be connected to a neighboring second lead of the plurality of leads by way of the lead pad. The first lead may be connected to a flag portion of the leadframe, the flag portion proximate to the active side of the semiconductor die. The lead pad exposed through the encapsulant may be configured for connection of an external component. The distal portion of each lead of the plurality of leads exposed through the encapsulant may be configured for connection to a printed circuit board. The first lead of the plurality of leads and the lead pad may be formed from a same contiguous metal.

In another embodiment, there is provided, a method including connecting a plurality of bond pads located at an active side of a semiconductor die to a corresponding plurality of leads of a leadframe, a first lead of the plurality of leads having a lead pad formed between a distal portion of the first lead and a proximal portion of the first lead; and encapsulating with an encapsulant the semiconductor die and at least a portion of the leadframe, a distal portion of each lead of the plurality of leads exposed through the encapsulant at a first major side and the lead pad exposed through the encapsulant at a second major side opposite of the first major side. The first lead of the plurality of leads may be formed such that the lead pad is located on a plane substantially farther from the semiconductor die than a plane of the proximal portion of the first lead. The plurality of leads of the leadframe may be formed in a downset configuration such that the distal portion of each lead of the plurality of leads is substantially coplanar with a backside of the semiconductor die. The backside of the semiconductor die may be exposed through the encapsulant at the first major side. Each bond pad of the plurality of bond pads may be connected to the proximal portion of a corresponding lead of the plurality of leads by way of a die connector. The leadframe may be configured for a quad flat no-lead (QFN) type package.

In yet another embodiment, there is provided, a semiconductor device including a leadframe including a plurality of leads, a first lead of the plurality of leads having a lead pad formed from a same contiguous metal between a distal portion of the first lead and a proximal portion of the first lead, the lead pad located on a plane above the proximal portion; a semiconductor die having a plurality of bond pads located at an active side of the semiconductor die, each bond pad of the plurality of bond pads connected to a respective lead of the plurality of leads; and an encapsulant encapsulating the semiconductor die and at least a portion of the leadframe, a distal portion of each lead of the plurality of leads exposed through the encapsulant at a first major side and the lead pad exposed through the encapsulant at a second major side opposite of the first major side. The plane of the lead pad and the proximal portion of the first lead may be substantially parallel. A backside of the semiconductor die may be exposed through the encapsulant at the first major side. Each bond pad of the plurality of bond pads may be connected to the respective lead of the plurality of leads by way of a stud bump. The lead pad exposed through the encapsulant at the second major side may be configured for connection of an external component.

By now, it should be appreciated that there has been provided a semiconductor device having a dual downset leadframe. The semiconductor device includes a semiconductor die mounted on a package leadframe. The leadframe includes a plurality of leads. Each lead of the plurality has a proximal portion located near the semiconductor die and a distal portion located near an outer perimeter of the semiconductor device package. The proximal portions are downset by a first distance sufficient for the backside of the mounted semiconductor die to be substantially coplanar with the distal portions of the leads. Bond pads of the semiconductor die are conductively connected to respective proximal portions of the leads the leadframe. A lead pad is formed between the distal portion and the proximal portion of at least one lead of the plurality. A plurality of lead pads may be formed on corresponding leads of leadframe. Each lead pad is downset a second distance farther from the semiconductor die than the first downset distance. The semiconductor die and the leadframe are encapsulated with an encapsulant. Each lead pad of the plurality of lead pad of the plurality of lead pads is exposed through the top side of the encapsulant. Likewise, the backside of the semiconductor die and the distal portion of each lead of the plurality of leads is exposed through the bottom side of the encapsulant. The exposed distal portions of the leads are configured for attachment to a printed circuit board and the exposed lead pads are configured for attachment of an external component, for example. By forming the semiconductor device with the dual downset leadframe in this manner, cost effective and improved reliability through package interconnects and semiconductor die connections may be realized.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:

a leadframe including a plurality of leads, a first lead of the plurality of leads having a lead pad formed between a distal portion of the first lead and a proximal portion of the first lead;

a semiconductor die having a plurality of bond pads located at an active side of the semiconductor die, each bond pad of the plurality of bond pads connected to a respective lead of the plurality of leads; and an encapsulant encapsulating the semiconductor die and at least a portion of the leadframe, a distal portion of each lead of the plurality of leads exposed through the encapsulant at a first major side, the distal portion of each lead of the plurality of leads exposed through the encapsulant being configured for connection to a printed circuit board, and the lead pad exposed through the encapsulant at a second major side opposite of the first major side.

2. The semiconductor device of claim 1, wherein a backside of the semiconductor die is exposed through the encapsulant at the first major side.

3. The semiconductor device of claim 1, wherein each bond pad of the plurality of bond pads is connected to the respective lead of the plurality of leads by way of a die connector.

4. The semiconductor device of claim 1, wherein the first lead of the plurality of leads is formed such that the lead pad is located on a plane farther from the semiconductor die than a plane of the proximal portion of the first lead.

5. The semiconductor device of claim 1, wherein the first lead is connected to a neighboring second lead of the plurality of leads by way of the lead pad.

6. The semiconductor device of claim 1, wherein the first lead is connected to a flag portion of the leadframe, the flag portion proximate to the active side of the semiconductor die.

7. The semiconductor device of claim 1, wherein the lead pad exposed through the encapsulant is configured for connection of an external component.

8. The semiconductor device of claim 1, wherein the first lead of the plurality of leads and the lead pad are formed from a same contiguous metal.

9. A method, comprising:

connecting a plurality of bond pads located at an active side of a semiconductor die to a corresponding plurality of leads of a leadframe, a first lead of the plurality of leads having a lead pad formed between a distal portion of the first lead and a proximal portion of the first lead; and encapsulating with an encapsulant the semiconductor die and at least a portion of the leadframe, a distal portion of each lead of the plurality of leads exposed through the encapsulant at a first major side, the distal portion of each lead of the plurality of leads exposed through the encapsulant being configured for connection to a printed circuit board, and the lead pad exposed through the encapsulant at a second major side opposite of the first major side.

10. The method of claim 9, wherein the first lead of the plurality of leads is formed such that the lead pad is located on a plane substantially farther from the semiconductor die than a plane of the proximal portion of the first lead.

11. The method of claim 9, wherein the plurality of leads of the leadframe are formed in a downset configuration such that the distal portion of each lead of the plurality of leads is substantially coplanar with a backside of the semiconductor die.

12. The method of claim 11, wherein the backside of the semiconductor die is exposed through the encapsulant at the first major side.

13. The method of claim 9, wherein each bond pad of the plurality of bond pads is connected to the proximal portion of a corresponding lead of the plurality of leads by way of a die connector.

14. The method of claim 9, wherein the leadframe is configured for a quad flat no-lead (QFN) type package.

15. A semiconductor device comprising:

a leadframe including a plurality of leads, a first lead of the plurality of leads having a lead pad formed from a same contiguous metal between a distal portion of the first lead and a proximal portion of the first lead, the lead pad located on a plane above the proximal portion;

a semiconductor die having a plurality of bond pads located at an active side of the semiconductor die, each bond pad of the plurality of bond pads connected to a respective lead of the plurality of leads; and an encapsulant encapsulating the semiconductor die and at least a portion of the leadframe, a distal portion of each lead of the plurality of leads exposed through the encapsulant at a first major side, the distal portion of each lead of the plurality of leads exposed through the encapsulant being configured for connection to a printed circuit board, and the lead pad exposed through the encapsulant at a second major side opposite of the first major side.

16. The semiconductor device of claim 15, wherein the plane of the lead pad and the proximal portion of the first lead are substantially parallel.

17. The semiconductor device of claim 15, wherein a backside of the semiconductor die is exposed through the encapsulant at the first major side.

18. The semiconductor device of claim 15, wherein each bond pad of the plurality of bond pads is connected to the respective lead of the plurality of leads by way of a stud bump.

19. The semiconductor device of claim 15, wherein the lead pad exposed through the encapsulant at the second major side is configured for connection of an external component.

* * * * *